United States Patent
Lee et al.

(10) Patent No.: US 8,729,570 B2
(45) Date of Patent: May 20, 2014

(54) MASK FRAME ASSEMBLY FOR THIN FILM DEPOSITION, ORGANIC LIGHT-EMITTING DISPLAY DEVICE USING THE SAME, AND METHOD OF MANUFACTURING THE ORGANIC LIGHT-EMITTING DISPLAY DEVICE

(75) Inventors: Kang-Il Lee, Yongin (KR); Jae-Seok Park, Yongin (KR); Young-Geun Cho, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 369 days.

(21) Appl. No.: 13/053,900

(22) Filed: Mar. 22, 2011

(65) Prior Publication Data

US 2011/0227099 A1 Sep. 22, 2011

(30) Foreign Application Priority Data

Mar. 22, 2010 (KR) ........................ 10-2010-0025305

(51) Int. Cl.
*H01L 33/00* (2010.01)
(52) U.S. Cl.
USPC .............................................. 257/88; 438/34
(58) Field of Classification Search
USPC ................ 257/40, 88, 89, E33.001, E51.022; 438/99, 34
See application file for complete search history.

(56) References Cited

U.S. PATENT DOCUMENTS

| | | | |
|---|---|---|---|
| 6,919,681 B2 * | 7/2005 | Cok et al. ...................... 313/500 |
| 2004/0051448 A1 | 3/2004 | Matsumoto | |
| 2004/0214449 A1 | 10/2004 | Yotsuya et al. | |
| 2005/0001542 A1 * | 1/2005 | Kiguchi ........................ 313/504 |
| 2005/0087740 A1 * | 4/2005 | Matsumoto et al. ............ 257/72 |
| 2006/0012290 A1 * | 1/2006 | Kang ............................. 313/504 |
| 2006/0017375 A1 * | 1/2006 | Noguchi et al. ............... 313/504 |
| 2006/0231842 A1 * | 10/2006 | Hirakata et al. ................. 257/72 |
| 2008/0084376 A1 * | 4/2008 | Hirota et al. ..................... 345/88 |
| 2008/0316413 A1 * | 12/2008 | Cho .............................. 349/144 |
| 2009/0121983 A1 | 5/2009 | Sung et al. | |
| 2009/0322215 A1 | 12/2009 | Sung et al. | |
| 2010/0055810 A1 | 3/2010 | Sung et al. | |
| 2010/0060147 A1 * | 3/2010 | Eom .............................. 313/504 |
| 2010/0079067 A1 * | 4/2010 | Abe et al. ...................... 313/506 |

FOREIGN PATENT DOCUMENTS

| | | | |
|---|---|---|---|
| JP | 1994251704 A | | 9/1994 |
| JP | 10039791 A | * | 2/1998 |
| JP | 2004-111082 A | | 4/2004 |

(Continued)

OTHER PUBLICATIONS

The Registration Determination Certificate issued by Korean Intellectual Property Office, corresponding to KR 10-2010-0025305 and Request for Entry attached herewith.

*Primary Examiner* — Michele Fan
(74) *Attorney, Agent, or Firm* — Robert E. Bushnell, Esq.

(57) ABSTRACT

A mask frame assembly for thin film deposition, an organic light-emitting display device using the same, and a method of manufacturing the organic light-emitting display device. The organic light-emitting display device includes a first electrode and a second electrode patterned on a substrate to face each other, and a plurality of organic layers formed between the first and second electrodes. The plurality of organic layers include at least a plurality of stripe-shaped organic layers and a plurality of discontinuous dot-shaped organic layers.

11 Claims, 8 Drawing Sheets

(56) References Cited

FOREIGN PATENT DOCUMENTS

| | | | |
|---|---|---|---|
| KR | 1998065883 | * | 10/1998 |
| KR | 100418026 B1 | | 1/2004 |
| KR | 10-2004-0067929 A | | 7/2004 |
| KR | 20050019698 | | 3/2005 |
| KR | 1020050052281 A | | 6/2005 |
| KR | 1020050060075 A | | 6/2005 |
| KR | 1020060023497 A | | 3/2006 |
| KR | 2006055097 A | * | 5/2006 |
| KR | 1020060055097 A | | 5/2006 |
| KR | 1020070012895 A | | 1/2007 |
| KR | 10-2009-0049515 A | | 5/2009 |

* cited by examiner

MASK FRAME ASSEMBLY FOR THIN FILM DEPOSITION, ORGANIC LIGHT-EMITTING DISPLAY DEVICE USING THE SAME, AND METHOD OF MANUFACTURING THE ORGANIC LIGHT-EMITTING DISPLAY DEVICE

CLAIM OF PRIORITY

This application makes reference to, incorporates into this specification the entire contents of, and claims all benefits accruing under 35 U.S.C. §119 from an application earlier filed in the Korean Intellectual Property Office on Mar. 22, 2010, and there duly assigned Ser. No. 10-2010-0025305.

BACKGROUND OF THE INVENTION

1. Field of the Invention

The present invention relates to an organic light-emitting display device, and more particularly, to a mask frame assembly for thin film deposition that has realized high resolution in a small-sized product and that may be easily manufactured, an organic light-emitting display device using the same, and a method of manufacturing the organic light-emitting display device.

2. Description of the Related Art

Generally, organic light emitting display devices have superior characteristics such as wide viewing angles, high contrast ratios, and short response times.

SUMMARY OF THE INVENTION

It is therefore an aspect of the present invention to provide an improved organic light-emitting display device.

It is another aspect of the present invention to provide a mask frame assembly for thin film deposition, having an improved structure in which high resolution can be realized in a small-sized product by varying pattern shapes of masks, an organic light-emitting display device using the same, and a method of manufacturing the organic light-emitting display device.

According to an aspect of the present invention, there is provided an organic light-emitting display device including a first electrode and a second electrode patterned on a substrate to face each other; and a plurality of organic layers formed between the first and second electrodes. The plurality of organic layers include a plurality of stripe-shaped organic layers and a plurality of discontinuous dot-shaped organic layers.

The plurality of stripe-shaped organic layers may include first organic layers extending from a first terminal portion of the substrate to a second and opposite terminal portion of the substrate along a first direction of the substrate, and second organic layers extending from a third terminal portion of the substrate to a fourth and opposite terminal portion of the substrate along a second direction of the substrate and crossing the first organic layer.

The discontinuous dot-shaped organic layers may be discontinuously formed from the third terminal portion of the substrate to the fourth terminal portion of the substrate along a direction parallel to the second organic layers. Each one of the discontinuous dot-shaped organic layers may be arranged in a space surrounded by two neighboring first organic layers and two neighboring second organic layers, and may constitute one pixel together with a first organic layer and a second organic layer.

A size of an emission region of an organic layer formed of material having a relatively low light-emission efficiency may be greater than a surface area of an emission region of another organic layer formed of material having a relatively high light-emission efficiency.

Each one of a surface area of an emission region of a stripe-shaped first organic layer and a surface area of an emission region of a dot-shaped organic layer, may be greater than a surface area of an emission region of a stripe-shaped second organic layer.

According to another aspect of the present invention, there is provided a method for manufacturing an organic light-emitting display device. The method includes forming stripe-shaped first organic layers on a substrate, forming stripe-shaped second organic layers on the substrate, and forming dot-shaped third organic layers on the substrate.

The first organic layers may extend from a first terminal portion of the substrate to a second and opposite terminal portion of the substrate along a first direction of the substrate, and the second organic layers may extend from a third terminal portion of the substrate to a fourth and opposite terminal portion of the substrate along a second direction of the substrate. The first organic layers and the second organic layers may cross one another.

The dot-shaped third organic layers may be discontinuously formed from the third terminal portion of the substrate to the fourth terminal portion of the substrate along a direction parallel to the patterns of the second organic layers. Each one of the dot-shaped third organic layers may be arranged in a space surrounded by two neighboring first organic layers and two neighboring second organic layers, and may constitute one pixel together with a first organic layer and a second organic layers.

A surface area of an emission region of an organic layer formed of material having a relatively low light-emission efficiency is greater than a surface area of an emission region of another organic layer formed of material having a relatively high light-emission efficiency.

Each one of a surface area of an emission region of the stripe-shaped first organic layer and a surface area of an emission region of the dot-shaped organic layer, may be greater than a surface area of an emission region of the stripe-shaped second organic layer.

According to another aspect of the present invention, there is provided a mask frame assembly for thin film deposition, used to deposit organic layer patterns on a substrate. The mask frame assembly includes a first mask having stripe-shaped first slits for providing a passage upon which material for forming strip-shaped first organic layers is deposited on the substrate, a second mask having stripe-shaped second slits for providing a passage upon which material for forming strip-shaped second organic layers is deposited on the substrate, and a third mask having dot-shaped third slits for providing a passage upon which material for forming dot-shaped third organic layers is deposited.

The stripe-shaped first slits may extend from a first terminal portion of the substrate to a second and opposite terminal portion of the substrate along a first direction of the substrate, and the stripe-shaped second slits may extend from a third terminal portion of the substrate to a fourth and opposite terminal portion of the substrate along a second direction of the substrate, so that the stripe-shaped second slits may be arranged on the substrate to cross the stripe-shaped first slits.

The dot-shaped third slits may be discontinuously patterned from the third terminal portion of the substrate to the fourth terminal portion of the substrate in a direction parallel to the stripe-shaped second slits. Each one of the dot-shaped third slits may be arranged in a space surrounded by two neighboring first slits and two neighboring second slits.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein:

FIGS. 4 through 6 illustrate masks for patterning pixels of the organic light-emitting display device of FIG. 2, and in detail.

FIGS. 7A through 7C illustrate a method of manufacturing the organic light-emitting display device including pixels of FIG. 2, according to an embodiment of the principles of the present invention, and in detail.

DETAILED DESCRIPTION OF THE INVENTION

Organic light-emitting display devices generally have a stacked structure including an anode, a cathode, and an emission layer interposed between the anode and the cathode. The devices display color images when holes and electrons, injected respectively from the anode and the cathode, recombine in the emission layer, which causes an emission of light. It is difficult, however, to achieve high light-emission efficiency with such a structure, and thus intermediate layers, including an electron injection layer, an electron transport layer, a hole transport layer, a hole injection layer, etc., are optionally interposed between the emission layer and each of the electrodes.

The electrodes and the intermediate layers may be formed using a variety of methods, such as a deposition method. When an organic light-emitting display device is manufactured using the deposition method, a fine metal mask (FMM) formed with openings (hereinafter, referred to as "slits") having the same pattern as a thin film to be formed on a substrate, is disposed to contact the substrate, and a thin film material is deposited through the slits of the FMM in order to form the thin film having the desired pattern on the substrate.

When patterns are formed using the FMM, the thickness of masks and a distance between the patterns on the masks have a close relation with the position of the patterns to be formed, the shape of the patterns, and the resolution of the patterns. When conventional masks having stripe-shaped or dot-shaped patterns are used, however, a distance between the patterns and a size of an opening region over which the patterns are to be formed, should be small in order to manufacture a small-sized product having high resolution. Thus, it is not easy to manufacture the FMM according to the distance between the patterns and the size of the opening region described above.

For example, when stripe-shaped red, green, and blue pixels are formed, a pitch between pixels in a three-inch video graphics array (VGA) product is about 32 micrometers, and a width of an opening region is 12 micrometers when considering a pixel defining layer having a width of 20 micrometers. The values described above are to approximate to a manufacturing limitation of the FMM.

Furthermore, due to characteristics of material for forming the emission layer, light-emission efficiency of red, green, and blue emission layers are different from one another, and thus, the ratio of the area of an emission region of each of the red, green, and blue emission layers with respect to the entire area of the organic light-emitting display device should be varied. Thus, since areas of red and blue emission regions should be several times greater than the area of green emission region, it is not easy to manufacture a small-sized VGA product.

The present invention will now be described more fully with reference to the accompanying drawings in which exemplary embodiments of the invention are shown.

Figure 1:
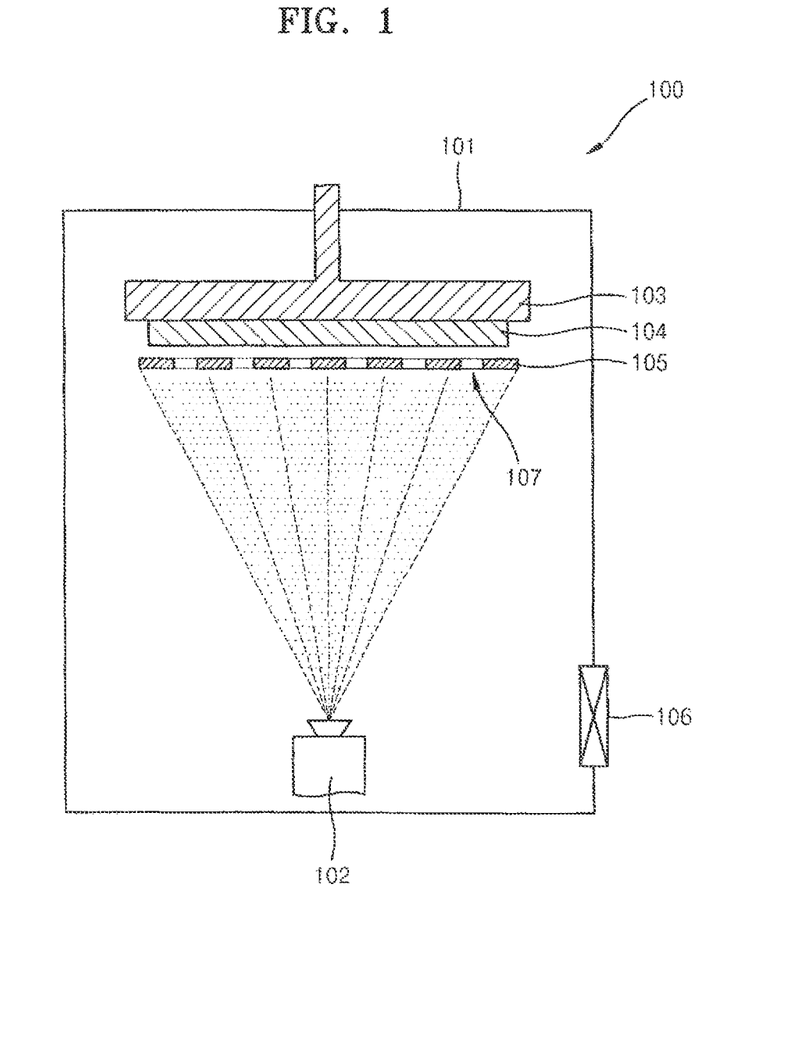
FIG. 1 is a schematic oblique view of a vacuum deposition apparatus constructed as an embodiment according to the principles of the present invention.

FIG. 1 is a schematic oblique view of a vacuum deposition apparatus 100, constructed as an embodiment according to the principles of the present invention. Referring to FIG. 1, vacuum deposition apparatus 100 according to the current embodiment of the present invention includes a vacuum chamber 101. At least one deposition source 102 in which an organic material can be vaporized is disposed in vacuum chamber 101. A substrate mounting unit 103 is disposed in a side of vacuum chamber 101 opposite to the side in which deposition source 102 is disposed. A substrate 104 upon which the organic material is to be deposited is mounted on substrate mounting unit 103. A Mask 105 having predetermined opening patterns 107 is arranged between substrate 104 and deposition source 102, aligned with substrate 104, and separated from substrate 104 by a predetermined distance. Vacuum chamber 101 may be maintained at an appropriate vacuum via an exhaust device 106.

In order to obtain thickness uniformity of deposited organic thin films, substrate 103 may be rotated, or deposition source 102 may make a linearly reciprocating motion. Mask 105 having opening patterns 107 is used so as to form organic thin film patterns having a predetermined shape over substrate 103. In detail, the organic material vaporized in deposition source 102 may pass through opening patterns 107 of masks 105 and may be deposited on substrate 103.

Figure 2:
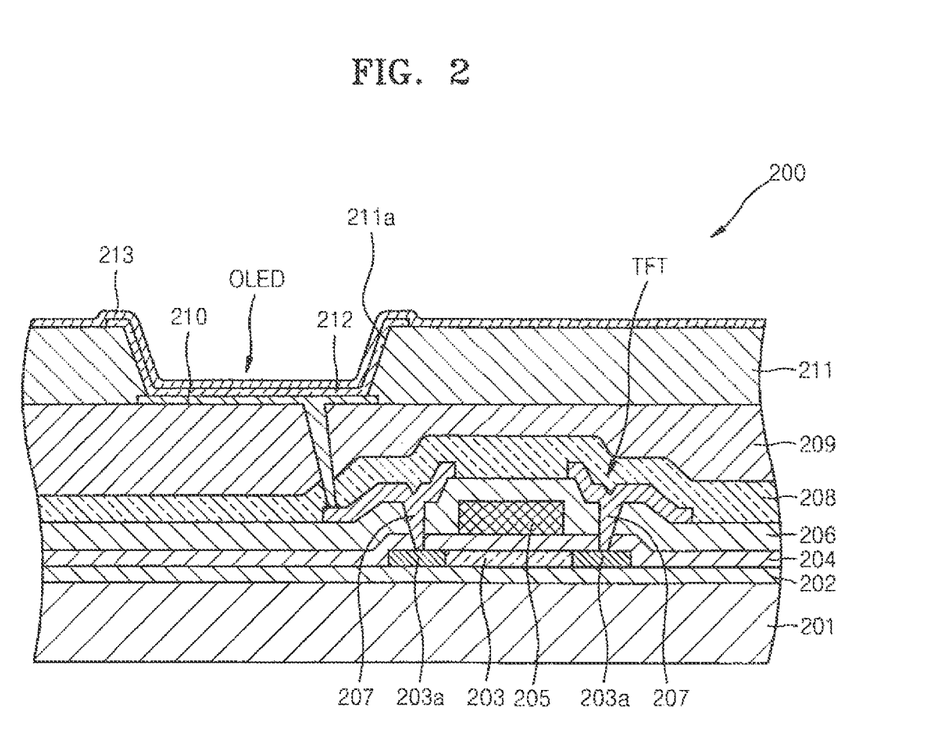
FIG. 2 is a cross-sectional view showing a sub-pixel of an organic light-emitting display device constructed as an embodiment according to the principles of the present invention.

FIG. 2 is a cross-sectional view showing a sub-pixel of an active matrix (AM) organic light-emitting display device 200 deposited by using vacuum deposition apparatus 100 of FIG. 1, constructed as an embodiment according to the principles of the present invention.

The sub-pixel includes at least one thin film transistor (TFT) and an organic light-emitting diode (OLED). The TFT is not limited to the structure illustrated in FIG. 2, and the number and the structure of TFTs may be modified in various ways.

Referring to FIG. 2, a buffer layer 202 is formed on a substrate 201. Substrate 201 is formed of glass or plastic. A semiconductor active layer 203 having a predetermined pattern is formed on buffer layer 202. A gate insulating layer 204 is formed on semiconductor active layer 203, and a gate electrode 205 is formed in a predetermined region of gate insulating layer 204.

Gate electrode 205 is connected to a gate line (not shown) that applies a TFT ON/OFF signal. An interlayer insulating layer 206 is formed on gate electrode 205. Source/drain electrodes 207 are formed such as to contact source/drain regions 203a of semiconductor active layer 203.

A passivation layer 208 is formed of $SiO_2$, $SiN_x$, etc. on source/drain electrodes 207. A planarization layer 209 is formed of an organic material, such as acryl, polyimide, benzocyclobutene (BCB), etc., on passivation layer 208.

A pixel electrode 210, which functions as an anode of the OLED, is formed on planarization layer 209, and a pixel defining layer (PDL) 211 formed of an organic material is formed to cover pixel electrode 210. A predetermined opening 211a is formed in PDL 211, and an organic layer 212 is formed on a surface of PDL 211 and on a surface of pixel electrode 210 exposed through the opening 211a. Organic layer 212 includes an emission layer. Aspects of the present invention are not limited to the structure of the organic light-emitting display device 200 described above, and various structures of organic light-emitting display devices may be applied to the present invention.

The OLED displays predetermined image information by emitting red, green and blue light as current flows. The OLED includes pixel electrode 210 as a first electrode, which is connected to source/drain electrodes 207 of the TFT and to which a positive power voltage is applied, an opposite electrode 213 as a second electrode, which is formed so as to cover the entire sub-pixel and to which a negative power voltage is applied, and organic layer 212, which is disposed between pixel electrode 210 and opposite electrode 213 to emit light.

Pixel electrode 210 and opposite electrode 213 are insulated from each other by organic layer 212, and respectively apply voltages of opposite polarities to organic layer 212 to induce light emission in organic layer 212.

Pixel electrode 210 functions as an anode, and opposite electrode 213 functions as a cathode. Alternatively, pixel electrode 210 may function as a cathode, and opposite electrode 213 may function as an anode.

Pixel electrode 210 may be formed as a transparent electrode or a reflective electrode.

When pixel electrode 210 is formed as a transparent electrode, such a transparent electrode may be formed of indium tin oxide (ITO), indium zinc oxide (IZO), zinc oxide (ZnO), or indium oxide ($In_2O_3$). When pixel electrode 210 is formed as a reflective electrode, such a reflective electrode may be formed by forming a reflective layer from silver (Ag), magnesium (Mg), aluminum (Al), platinum (Pt), palladium (Pd), gold (Au), nickel (Ni), neodymium (Nd), iridium (Ir), chromium (Cr) or a compound thereof and forming a layer of ITO, IZO, ZnO, or $In_2O_3$ on the reflective layer.

Opposite electrode 213 may also be formed as a transparent electrode or a reflective electrode. When opposite electrode 63 is formed as a transparent electrode, opposite electrode 213 functions as a cathode. To this end, such a transparent electrode may be formed by depositing a metal having a low work function, such as lithium (Li), calcium (Ca), lithium fluoride/calcium (LiF/Ca), lithium fluoride/aluminum (LiF/Al), aluminum (Al), silver (Ag), magnesium (Mg), or a compound thereof on a surface of organic layer 212 and forming an auxiliary electrode layer or a bus electrode line thereon from a transparent electrode forming material, such as ITO, IZO, ZnO, $In_2O_3$, or the like. When opposite electrode 213 is formed as a reflective electrode, the reflective layer may be formed by depositing Li, Ca, LiF/Ca, LiF/Al, Al, Ag, Mg, or a compound thereof on the entire surface of organic layer 212.

When pixel electrode 210 is formed as the transparent electrode or the reflective electrode, pixel electrode 210 may be formed to have a shape corresponding to an opening shape of each sub-pixel. Also, opposite electrode 213 may be formed as the transparent electrode or the reflective electrode by depositing the organic material on the entire region of organic light-emitting display device 200. However, opposite electrode 213 does not need to be formed by depositing the organic material on the entire region of organic light-emitting display device 200. Obviously, opposite electrode 213 may be formed in various patterns. Obviously, positions of pixel electrode 210 and opposite electrode 213 may be opposite to each other.

Organic layer 212 may include a low-molecular weight organic layer or a high-molecular weight organic layer. When a low-molecular weight organic layer is used as organic layer 212, organic layer 212 may have a single or multi-layer structure including at least one selected from the group consisting of a hole injection layer (HIL), a hole transport layer (HTL), an emission layer (EML), an electron transport layer (ETL), an electron injection layer (EIL), etc. Examples of available organic materials include copper phthalocyanine (CuPc), N,N'-di(naphthalene-1-yl)-N,N'-diphenyl-benzidine (NPB), tris-8-hydroxyquinoline aluminum (Alq3), etc. The low-molecular weight organic layer may be formed by vacuum deposition.

When a high-molecular weight organic layer is used as organic layer 212, organic layer 212 may mostly have a structure including a HTL and an EML. In this case, the HTL may be formed of poly(ethylenedioxythiophene) (PEDOT), and the EML may be formed of polyphenylenevinylenes (PPVs) or polyfluorenes. The HTL and the EML may be formed by screen printing, inkjet printing, or the like.

Organic layer 212 is not limited to the organic layers described above, and may be embodied in various ways.

Organic layer 212 constitutes a pixel having predetermined patterns that corresponds to the masks for forming organic layer 212. The masks may have predetermined patterns.

Figure 3:
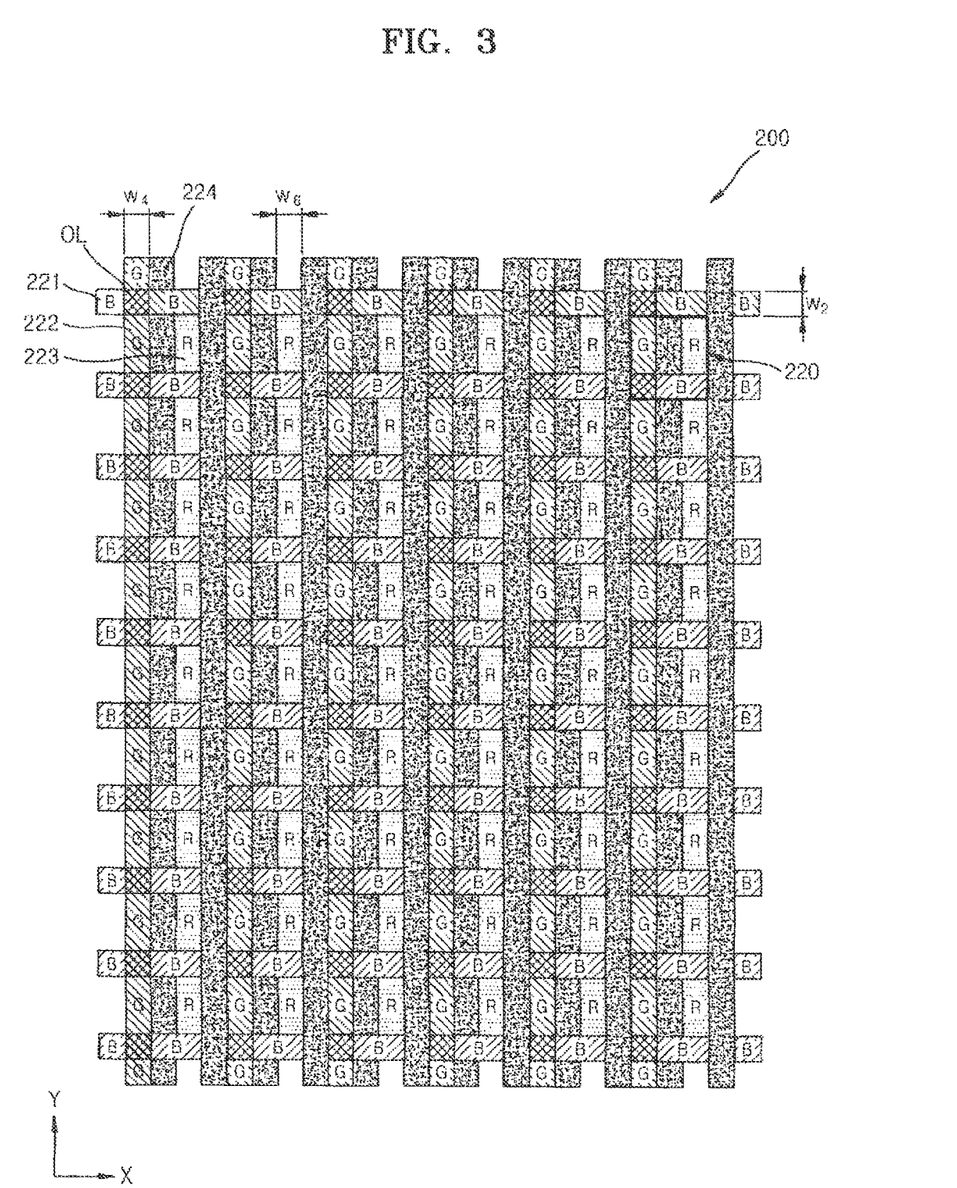
FIG. 3 illustrates arrangement of pixels of the organic light-emitting display device of FIG. 2, as an embodiment according to the principles of the present invention.

FIG. 3 illustrates arrangement of pixels 220 of organic light-emitting display device 200 of FIG. 2, according to an embodiment of the principles of the present invention. Referring to FIG. 3, organic light-emitting display device 200 includes a plurality of first organic layers 221 and a plurality of second organic layers 222, each having stripe-shaped patterns, and a plurality of third organic layers 223 having dot-shaped patterns. Each one of pixels 220 of organic light-emitting display device 200 includes a stripe-shaped first organic layer 221, a stripe-shaped second organic layer 222, and a dot-shaped third organic layer 223.

The plurality of first organic layers 221 are patterned in the form of stripes in an X-direction parallel to a major surface of substrate 201 (see FIG. 2). First organic layers 221 extend from one end, that is, a terminal portion 201a forming an edge, of substrate 201 to the other end, that is, a terminal portion 201b, thereof. That is, each one of first organic layers 221 is formed as a stripe extending from a first end of substrate 201 to a second and opposite end of substrate 201. The plurality of stripe-shaped first organic layers 221 are repeatedly arranged in a Y-direction which is parallel to the major surface of substrate 201 and perpendicular to the X-direction (see FIG. 2), to be separated from one another by a predetermined distance. First organic layers 221 have organic patterns that emit blue light.

The plurality of second organic layers 222 are patterned in the form of stripes in the Y-direction of substrate 201 (see FIG. 2). Second organic layers 222 extend from one end, that is, a terminal portion 201c, of substrate 201 to the other end thereof, that is, a terminal portion 201d, in a direction crossing first organic layers 221. That is, each one of second organic layers 222 is formed as a stripe extending from a third end of substrate 201 to a fourth and opposite end of substrate 201. The plurality of stripe-shaped second organic layers 222 are repeatedly arranged in the X-direction of substrate 201 (see FIG. 2) to be separated from one another by a predetermined distance. Second organic layers 222 have organic patterns that emit green light.

An overlap region OL in which first organic layers 221 and second organic layers 222 cross one another and overlap one another, is formed. A pixel electrode 210 (see FIG. 2) is not connected to overlap region. OL, and thus light is not emitted from overlap region OL.

The plurality of third organic layers 223 are patterned in spaces where first organic layers 221 and second organic layers 222 cross one another, so as to constitute one pixel together with first and second organic layers 221 and 222. That is, each one of third organic layers 223 is formed as a dot in a space surrounded by two neighboring first organic layers 221 and two neighboring second organic layers 222. Third organic layers 223 are arranged in the Y-direction of substrate 201 in the form of discontinuous dots to be adjacent to first organic layers 221. Third organic layers 223 have organic patterns that emit red light.

In this manner, first organic layers 221, second organic layers 222, and third organic layers 223 are repeatedly arranged over the entire substrate 201 in the arrangement described above. First organic layers 221, second organic layers 222, and third organic layers 223 are not, however, limited to the arrangement illustrated in FIG. 3, and any structure including a plurality of organic layers having stripe-shaped patterns and a plurality of organic layers having dot-shaped patterns may have various arrangements.

Furthermore, in the case of any structure in which a plurality of organic layers having stripe-shaped patterns cross one another, the shape of the plurality of organic layers having stripe-shaped patterns and the shape of the plurality of organic layers having dot-shaped patterns are not limited to any one shape. Alternatively, the order in which patterns of red, green, and blue organic layers are arranged may be modified in various ways, unlike in the present embodiment, and the arrangement of first through third organic layers 221, 222, and 223 is not limited to a particular position.

Also, in the present embodiment, first organic layers 221 have patterns that emit blue light, and second organic layers 222 have patterns that emit green light, and third organic layers 223 have patterns that emit red light. Aspects of the present invention are not, however, limited thereto. First organic layers 221, second organic layers 222, and third organic layers 223 may be replaced with organic layers that emit different colors, such as white, yellow, magenta, cyan, and the like.

A reference number 224 denotes a non-emission region in which first organic layers 221, second organic layers 222, and third organic layer 223 are not formed.

Figure 4:
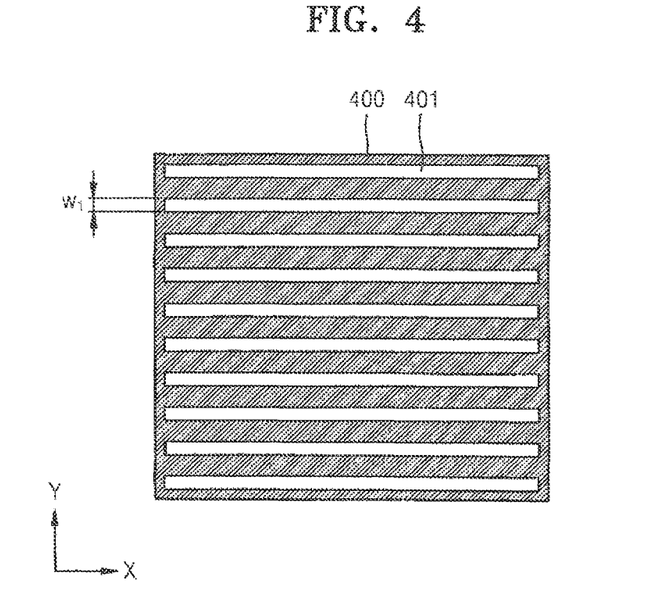
FIG. 4 illustrates a mask for forming first organic layers constructed as an embodiment according to the principles of the present invention.
Figure 5:
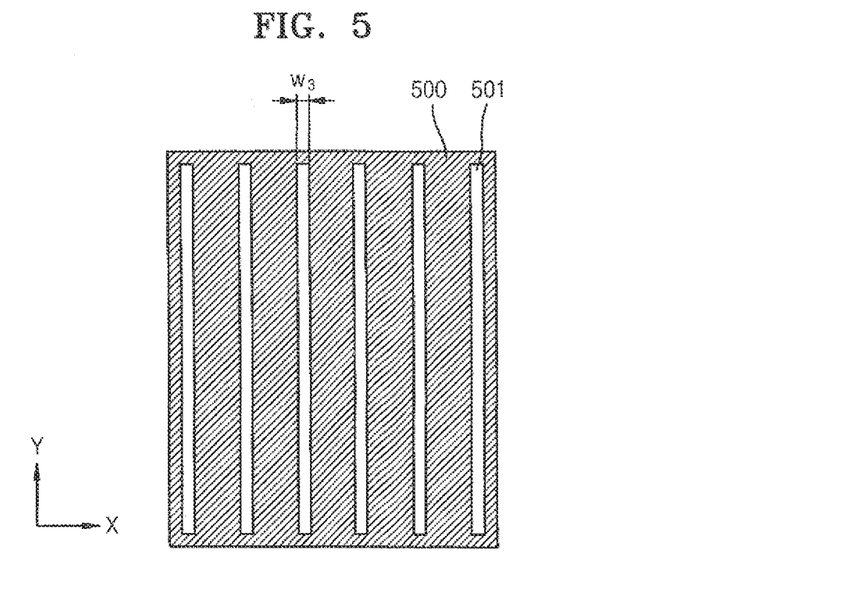
FIG. 5 illustrates a mask for forming second organic layers constructed as an embodiment according to the principles of the present invention.
Figure 6:
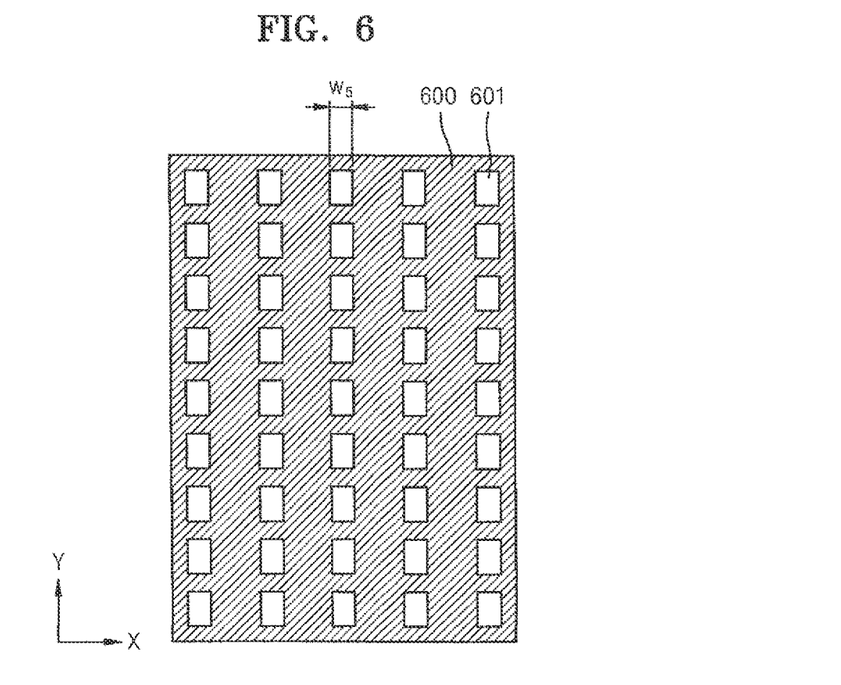
FIG. 6 illustrates a mask for forming a third organic layer constructed as an embodiment according to the principles of the present invention.

FIGS. 4 through 6 illustrate masks 400, 500, and 600 for patterning pixels 220 of organic light-emitting display device 200 of FIG. 2.

Referring to FIG. 4, stripe-shaped first slits 401 are formed in mask 400 for to forming first organic layers 221, with the slit being a narrow opening that penetrates through the depth of mask 400. The stripe-shaped first slits 401 extend from one end of mask 400 to the other end of mask 400 in an X-direction of mask 400 and are repeatedly arranged in a Y-direction of masks 400 to be separated from one another by a predetermined distance. Mask 400 is used to form first organic layers 221 that emit blue light, as illustrated in FIG. 3. The stripe-shaped first slits 401 provides a passage upon which material for forming first organic layers 221 that emit blue light is deposited on substrate 201. A width $w_1$ of each one of the stripe-shaped first slits 401, corresponds to a width $w_2$ of each one of first organic layers 221 that emit blue light.

Referring to FIG. 5, stripe-shaped second slits 501 are formed in mask 500 for forming second organic layers 222. The stripe-shaped second slits 501 extend from one end of mask 500 to the other end thereof in an X-direction of mask 500 and are repeatedly arranged in a Y-direction of mask 500 to be separated from one another by a predetermined distance. Mask 500 is used to form second organic layers 222 that emit green light, as illustrated in FIG. 3. The stripe-shaped second slits 501 provides a passage upon which material for forming second organic layers 222 that emit green light is deposited. A width $w_3$ of each one of the stripe-shaped second slits 501 corresponds to a width $w_4$ of each one of second organic layers 222 that emit green light.

In this regard, the stripe-shaped second slits 501 are arranged in a direction in which second slits 501 cross first slits 401 (see FIG. 4) so that second organic layers 222 that emit green light may be formed in a direction in which second organic layers 222 cross first organic layers 221 when the pixels of FIG. 3 are patterned.

Referring to FIG. 6, discontinuous dot-shaped third slits 601 are formed in mask 600 for forming third organic layer 223. The discontinuous dot-shaped third slits 601 extend from one end of mask 500 to the other end thereof in a Y-direction of mask 600 and are repeatedly arranged in an X-direction of mask 600 to be separated from one another by a predetermined distance. Third mask 600 is used to form third organic layer 223 that emits red light, illustrated in FIG. 3. Third slits 601 provides a passage upon which material for forming third organic layer 223 that emits red light is deposited. A width $w_5$ of each one of third slits 601 corresponds to a width $w_6$ of each one of third organic layers 223 that emit red light.

In this regard, third slits 601 are formed in such a way that third organic layers 223 that emit red light may be formed in a space surrounded by two neighboring first organic layers 221 that emit blue light and two neighboring second organic layers 222 that emit green light, when the pixels of FIG. 3 are patterned.

Also, the ratio of width $w_1$ of each one of the stripe-shaped first slits 401 with respect to width $w_3$ of each one of the stripe-shaped second slits 501, and the ratio of width $w_5$ of each one of the dot-shaped third slits 601 with respect to width $w_3$ of each one of the stripe-shaped second slits 501 are respectively 2:1 or more.

In the present embodiment, the ratios are illustrated as predetermined ratios. Aspects of the present invention are not, however, limited thereto, and width $w_1$ of each one of first slits 401, width $w_3$ of each one of second slits 501, and width $w_5$ of each one of third slits 601 may be arbitrarily adjusted according to light-emission efficiencies of materials for forming first through third organic layers 221, 222, and 223 that respectively emit blue, green, and red lights, in consideration of the area, that is, planar surface area, of each emission region of the first through third organic layers 221, 222, and 223 that are respectively formed by first through third slits 401, 501, and 601. That is, the sizes of the slits are established to be inversly proportional to light-emission efficiencies of materials for forming the corresponding organic layers.

For example, width $w_1$ of each one of first slits 401 for forming first organic layers 221 that emit blue light and are formed of material having relatively low light-emission efficiency, and width $w_5$ of each one of third slits 601 for forming third organic layers 223 that emit red light and are formed of material having relatively low light-emission efficiency, are greater than width $w_3$ of each one of second slits 501 for forming second organic layers 222 that emit green light and are formed of material having relatively high light-emission efficiency.

Width $w_2$ of each one of first organic layers 221 that emit blue light, width $w_4$ of each one of second organic layers 222 that emit green light, and width $w_6$ of each one of third organic layers 223 that emit red light, as illustrated in FIG. 3, may be easily formed with a desired size by optionally adjusting width $w_1$ of each one of first slits 401 formed in mask 400 for forming first organic layers 221, width $w_3$ of each one of second slits 501 formed in mask 500 for forming second organic layers 222, and width $w_5$ of each one of third slits 601 formed in mask 600 for forming third organic layers 223.

A method of manufacturing organic light-emitting display device 200 having the above structure of FIG. 2, according to an embodiment of the principles of the present invention will be described with reference to FIGS. 7A through 7C.

Figure 7A:
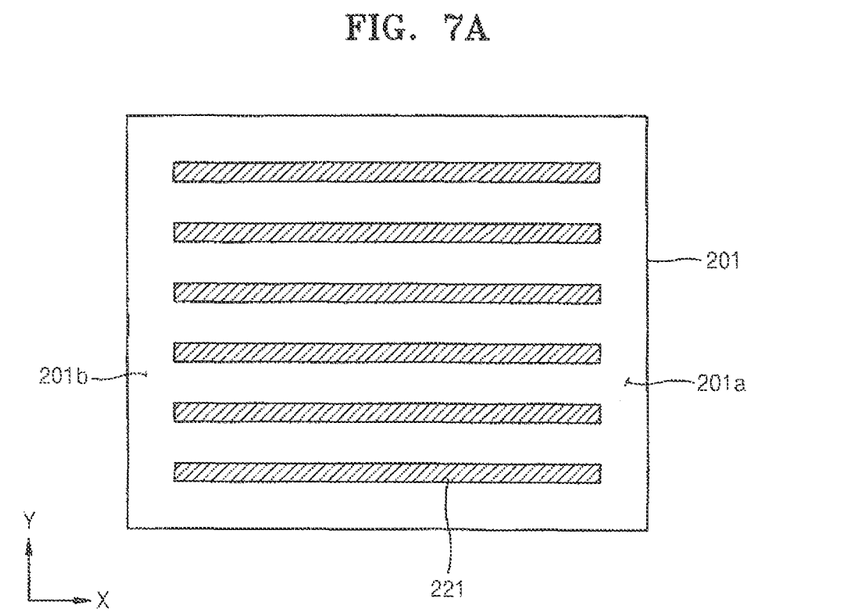
FIG. 7A illustrates the state where patterns of first organic layers have been formed on a substrate, according to an embodiment of the principles of the present invention.
Figure 7B:
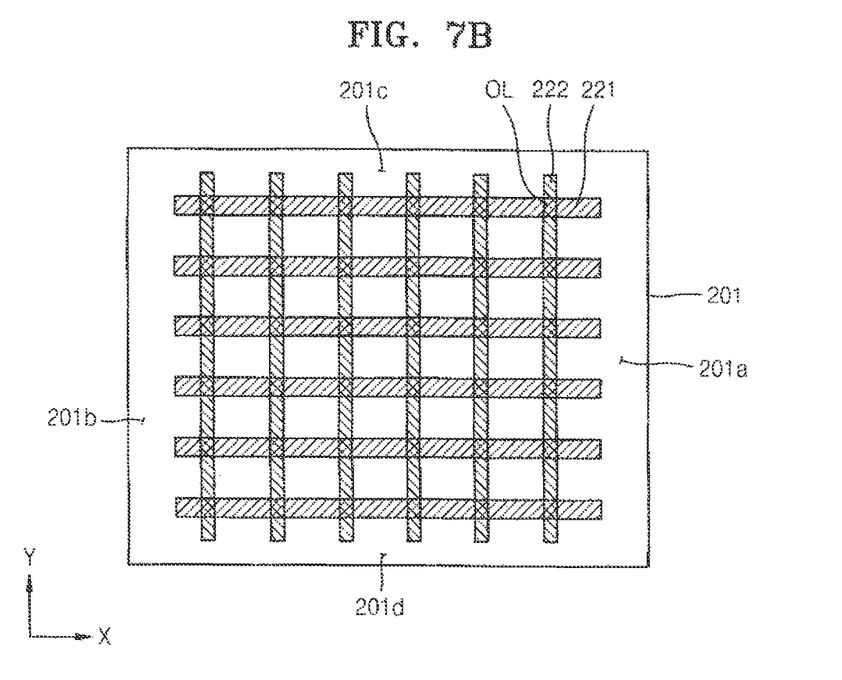
FIG. 7B illustrates the state where patterns of second organic layers as well as the patterns of the first organic layers have been formed on the substrate of FIG. 7A, according to an embodiment of the principles of the present invention.
Figure 7C:
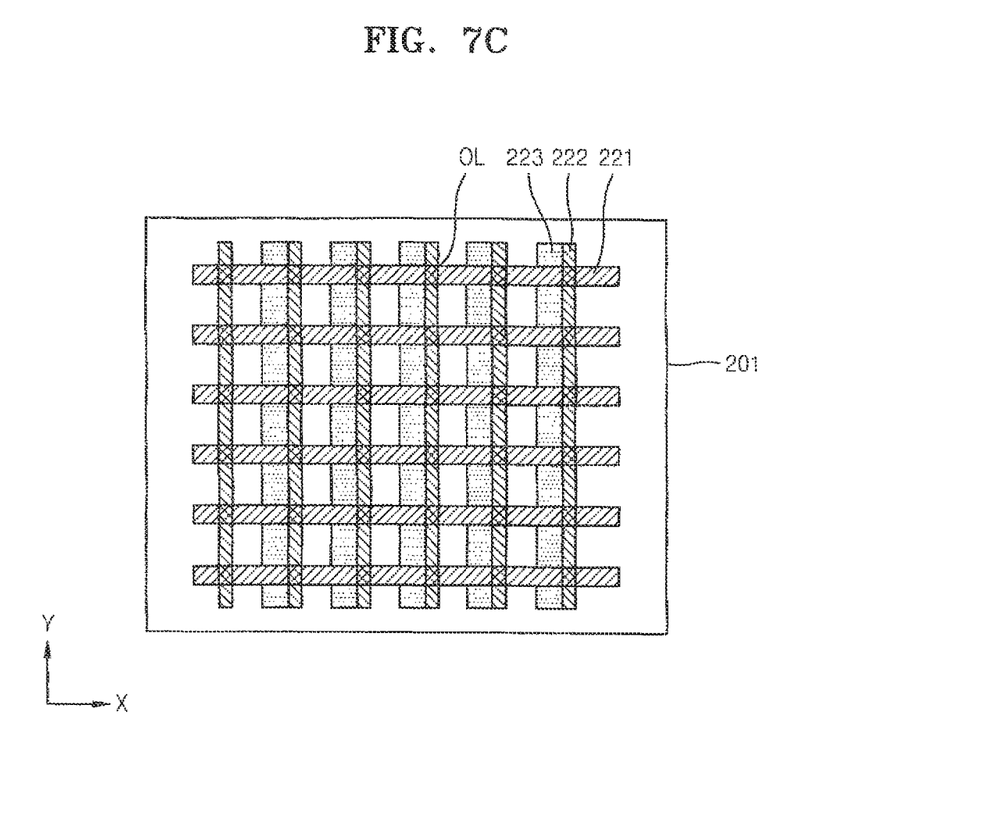
FIG. 7C illustrates the state where patterns of a third organic layer as well as the patterns of the first organic layers and the patterns of the second organic layers have been formed on the substrate of FIG. 7B, according to an embodiment of the principles of the present invention.

FIGS. 7A through 7C illustrate a method of manufacturing organic light-emitting display device 200 including pixels of FIG. 2, according to an embodiment of the present invention, and in detail, FIG. 7A illustrates organic light-emitting display device 200 in a state where patterns of first organic layers 221 have been formed on substrate 201, according to an embodiment of the present invention, FIG. 7B illustrates organic light-emitting display device 200 in a state where patterns of second organic layers 222 as well as the patterns of first organic layers 221 have been formed on substrate 201 of FIG. 7A, and FIG. 7C illustrates organic light-emitting display device 200 in a state where patterns of third organic layers 223 as well as the patterns of first organic layers 221 and the patterns of second organic layers 222 have been formed on substrate 201 of FIG. 7B.

Referring to FIG. 7A, first organic layers 221 that emit blue light are patterned in the X-direction of substrate 201 by using mask 400 (see FIG. 4) for forming first organic layers 221. Material for forming first organic layers 221 that emit blue light is deposited on substrate 201 through first slits 401 (see FIG. 4) of mask 400 for forming first organic layers 221 so that the stripe-shaped first organic layers 221, which emit blue light, may be formed in the X-direction of substrate 201.

Referring to FIG. 7B, second organic layers 222 that emit green light are patterned in the Y-direction of substrate 201 by using mask 500 (see FIG. 5) for forming second organic layers 222. Material for forming second organic layers 222 that emit blue light is deposited on substrate 201 through second slits 501 (see FIG. 5) of mask 500 for forming second organic layers 222 so that the stripe-shaped second organic layers 222, which emit green light, may be formed in the Y-direction of substrate 201.

Since second organic layers 222 that emit green light are arranged in a direction in which second organic layers 222 cross first organic layers 221 that emit blue light, overlap regions OL in which first organic layers 221 that emit blue light and second organic layers 222 that emit green light cross one another and overlap one another, are formed. No electrode is connected to overlaps region OL, and thus light is not emitted in overlap regions OL.

Referring to FIG. 7C, third organic layer 223 that emits red light is patterned over substrate 201 by using mask 600 (see FIG. 6) for forming third organic layer 223. Material for forming third organic layers 223 that emit red light is deposited on substrate 201 through third slits 601 (see FIG. 6) of mask 600 for forming third organic layer 223 so that the dot-shaped third organic layer 223, which emits red light, may be formed in a space surrounded by two neighboring first organic layers 221 that emit blue light and two neighboring second organic layers 222 that emit green light.

In this manner, when the red, green, and blue organic layer patterns are formed using mask 400 for forming the stripe-shaped first organic layers 221, mask 500 for forming the stripe-shaped second organic layers 222, and mask 600 for forming the dot-shaped third organic layer 223, since the dot-shaped third organic layer 223 is arranged in the space surrounded by two neighboring stripe-shaped first organic layers 221 that emit blue light and two neighboring stripe-shaped second organic layers 222 that emit green light, regions in which red, green, and blue organic layers are formed, in one pixel become more compact.

In this regard, first organic layers 221 that emit blue light, second organic layers 222 that emit green light, and third organic layers 223 that emit red light are formed at predetermined area ratios according to their light-emission efficiency.

Figure 8:
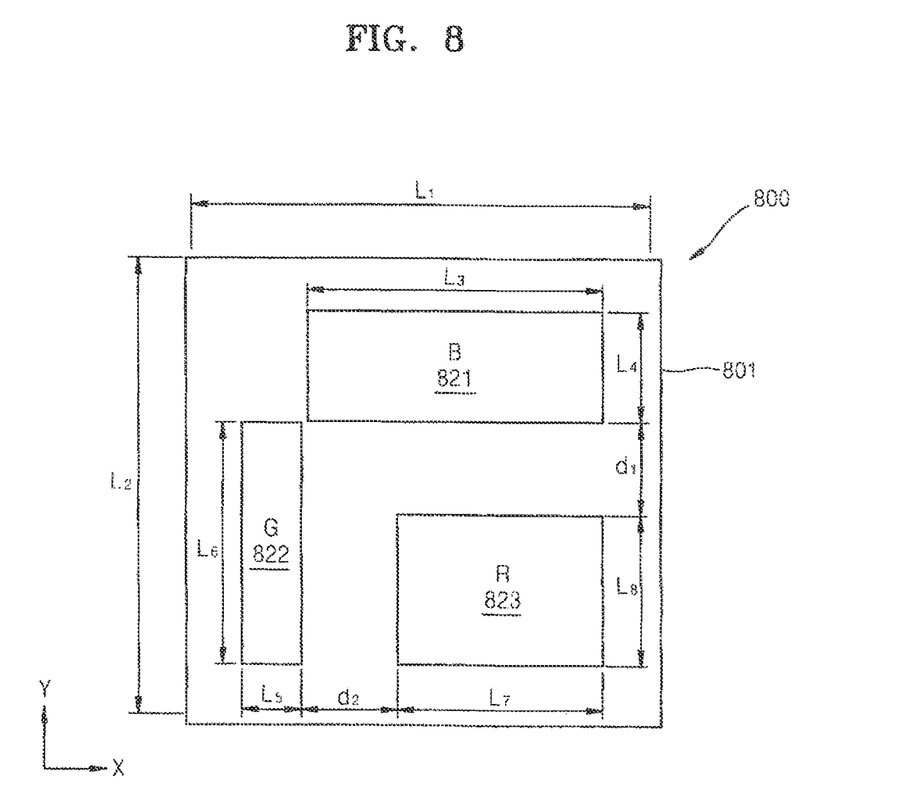
FIG. 8 illustrates comparison of the sizes of organic layers in one pixel, according to an embodiment of the principles of the present invention.

FIG. 8 illustrates comparison of the sizes of organic layers in one pixel, according to an embodiment of the principles of the present invention. Referring to FIG. 8, first organic layer 821 that emits blue light is arranged in an upper portion of a single pixel 800. First organic layers 821 that emit blue light are stripe-shaped organic layers that extend in an X-direction of substrate 801 so that first organic layers 821 may be disposed in each pixel.

Second organic layer 822 that emits green light is arranged in a left portion of pixel 800. Second organic layers 822 that emit green light are stripe-shaped organic layers that extend in a Y-direction of substrate 801 so that second organic layers 822 may be disposed in each pixel.

Third organic layer 823 that emits red light is arranged in a lower portion of pixel 800. That is, third organic layer 823 is disposed in a space surrounded by two neighboring first organic layers 821 that emit blue light and two neighboring second organic layers 822 that emit green light. Third organic layers 823 that emit red light are dot-shaped organic layers that are discontinuously arranged in the Y-direction of substrate 801 so that third organic layers 823 may be disposed in each pixel.

In this regard, each one of a surface area of an emission region of first organic layer 821 that emits blue light and a surface area of an emission region of third organic layer 823 that emits red light, is larger than a surface area of an emission region of second organic layer 822 that emits green light, due to characteristics of materials for forming to first through third organic layers 821, 822, and 823. The ratio of the area of first organic layer 821 that emits blue light with respect to the area of second organic layer 822 that emits green light, and the ratio of the area of third organic layer 823 that emits red light with respect to the area of second organic layer 822 that emits green light, may be respectively 2:1 or more.

For example, when a length L1 of one pixel 800 that is applicable to a three-inch video graphics array (VGA) small-sized product is 96 μm and a length L2 thereof is 96 μm, a length L3 and a length L4 of first organic layer 821 in pixel 800 that emit blue light are respectively 64 μm and 24 μm. As such, the area of first organic layer 821 in pixel 800 that emit blue light is 1536 μm².

Also, a length L7 and a length L8 of third organic layer 823 in pixel 800 that emits red light are respectively 44 μm and 32 μm. As such, the area of third organic layer 823 in pixel 800 that emits red light is 1408 μm².

Meanwhile, a length L5 and a length L6 of second organic layer 822 in pixel 800 that emit green light are respectively 12 μm and 52 μm. As such, the area of second organic layers 822 in pixel 800 that emit green light is 624 μm².

Meanwhile, a Y-direction distance $d_1$ between first organic layers 821 that emit blue light with respect to third organic layer 823 that emits red light, and an X-direction distance $d_2$ between second organic layers 822 that emit green light with respect to the region of third organic layer 823 that emits red light, are respectively 20 μm.

In this manner, by varying the sizes of first organic layer 821 that emits blue light, third organic layer 823 that emits red light, with respect to the size of second organic layer 822 that emits green light, the ratio of the area of first organic layer 821 that emits blue light, area of second organic layer 822 that emits green light, and the area of third organic layer 823 may be 2.46:1:2.25.

As such, when conventional stripe-shaped red, green, and blue organic layers have different light-emission efficiency, each one of the area of the red organic layers and the area of the blue organic layers should be twice or more greater than the area of the green organic layers, in one pixel. Thus, the conventional stripe-shaped red, green, and blue organic layers may not be easily applied to a three-inch VGA small-sized product. In the present embodiment, however, even if each one of the area of first organic layer 821 that emits blue light and the area of third organic layer 823 that emits red light is twice or more greater than the area of second organic layer 822 that emits green light, the three-inch VGA small-sized product may be realized according to the structure of arrangement of first organic layers 821 that emit blue light, second organic layers 822 that emit green light, and third organic layer 823 that emits red light, which have become compact as described above.

In the present embodiment, first organic layers 821, second organic layers 822, and third organic layer 823 refer to organic layer patterns that emit blue, green, and red light, respectively. Aspects of the present invention are not, however, limited thereto. First organic layers 821, second organic layers 822, and third organic layer 823 may be replaced with organic layers having patterns that emit different colors, such as white, yellow, magenta, cyan, and the like.

Also, the size of each emission region of first organic layers 821, second organic layers 822, and third organic layer 823 may be arbitrarily designed according to light-emission efficiency of materials for forming them.

Furthermore, the ratio of the areas of first and third organic layers 821 and 823 formed of material having relatively low light-emission efficiency with respect to the area of second organic layers 822 formed of material having relatively high light-emission efficiency is not limited to 2:1, like in the present embodiment and may be arbitrarily adjusted and furthermore, is not limited to any particular color.

For example, a stricture in which the sizes of an emission region of first organic layer 821 that emits blue light and is formed of material having relatively low light-emission efficiency, an emission region of third organic layer 823 that emits red light and is formed of material having relatively low light-emission efficiency, are greater than the size of an emission region of second organic layer 822 that emits green light and is formed of material having relatively high light-emission efficiency, is not limited to any area ratio.

Meanwhile, the order in which first organic layer 821, second organic layer 822, and third organic layer 823 are arranged, may be varied, unlike in the present embodiment. Arrangement of first organic layers 821, second organic layers 822, and third organic layer 823 are not limited to particular positions.

As described above, in the mask frame assembly for thin film deposition, the organic light-emitting display device using the same, and the method of manufacturing the organic light-emitting display device according to the present invention, organic layers in different colors can be compactly arranged so that a high resolution and small-sized product can be manufactured. Also, emission regions in different colors can be arbitrarily adjusted so that materials for forming the organic layers can be freely selected.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light-emitting display device, comprising:
    a first electrode and a second electrode formed on a substrate and facing each other; and
    a plurality of organic layers formed between the first and second electrodes, the plurality of organic layers comprising:
        a plurality of stripe-shaped first organic light-emitting layers continuously extending from a first terminal portion of the substrate to a second and opposite terminal portion of the substrate along a first direction;
        a plurality of stripe-shaped second organic light-emitting layers continuously extending from a third terminal portion of the substrate to a fourth and opposite terminal portion of the substrate along a second direction and crossing the first organic layers; and
        a plurality of discontinuous dot-shaped organic light-emitting layers discontinuously formed from the third terminal portion of the substrate to the fourth terminal portion of the substrate along a direction parallel to the second direction, each discontinuous dot-shaped organic light-emitting layer arranged in a space surrounded by two immediately adjacent stripe-shaped first organic light-emitting layers and by two immediately adjacent stripe-shaped second organic light-emitting layers and constituting one pixel together with one of the immediately adjacent stripe-shaped first organic light-emitting layers and one of the immediately adjacent stripe-shaped second organic light-emitting layers.

2. The organic light-emitting display device of claim 1, wherein each discontinuous dot-shaped organic light-emitting layer is spaced-apart from at least one of the stripe-shaped first and second organic light-emitting layers that are immediately adjacent to the respective discontinuous dot-shaped organic light-emitting layer.

3. The organic light-emitting display device of claim 1, wherein surface areas of the organic light-emitting layers are established to be inversely proportional to light-emission efficiencies of materials for forming the organic light-emitting layers.

4. The organic light-emitting display device of claim 1, wherein, among the plurality of organic light-emitting layers, a surface area of an emission region of an organic light-emitting layer formed of material having a relatively low light-emission efficiency is greater than a surface area of an emission region of another organic light-emitting layer formed of material having a relatively high light-emission efficiency.

5. The organic light-emitting display device of claim 4, each one of a surface area of an emission region of each one of the stripe-shaped first organic light-emitting layers and a surface area of an emission region of each one of the dot-shaped organic light-emitting layers, being greater than a surface area of an emission region of each one of the stripe-shaped second organic light-emitting layers, wherein one stripe-shaped first organic light-emitting layer, one dot-shaped organic light-emitting layer, and one stripe-shaped second organic light-emitting layer together constitute one pixel.

6. A method of manufacturing an organic light-emitting display device, the method comprising:
   forming stripe-shaped first organic light-emitting layers continuously extending from a first terminal portion of a substrate to a second and opposite terminal portion of the substrate along a first direction;
   forming stripe-shaped second organic light-emitting layers continuously extending from a third terminal portion of the substrate to a fourth and opposite terminal portion of the substrate along a second direction, the stripe-shaped second organic light-emitting layers crossing the stripe-shaped first organic light-emitting layers; and
   forming dot-shaped third organic light-emitting layers discontinuously formed from the third terminal portion of the substrate to the fourth terminal portion of the substrate along a direction parallel to the second direction, each discontinuous dot-shaped third organic light-emitting layer arranged in a space surrounded by two immediately adjacent stripe-shaped first organic light-emitting layers and by two immediately adjacent stripe-shaped second organic light-emitting layers and constituting one pixel together with one of the immediately adjacent stripe-shaped first organic light-emitting layers and one of the immediately adjacent stripe-shaped second organic light-emitting layers.

7. The method of claim 6, wherein each discontinuous dot-shaped third organic light-emitting layer extends between two of the stripe-shaped first organic light-emitting layers that are immediately adjacent to the respective discontinuous dot-shaped third organic light-emitting layer.

8. The method of claim 6, wherein each discontinuous dot-shaped third organic light-emitting layer is formed spaced-apart from at least one of the stripe-shaped first and second organic light-emitting layers that are immediately adjacent to the respective discontinuous dot-shaped third organic light-emitting layer.

9. The method of claim 6, wherein surface areas of the organic layers light-emitting are established to be inversely proportional to light-emission efficiencies of materials for forming the organic light-emitting layers.

10. The method of claim 6, wherein, among the organic light-emitting layers, a surface area of an emission region of an organic layer formed of material having a relatively low light-emission efficiency is greater than a surface area of an emission region of another organic layer formed of material having a relatively high light-emission efficiency.

11. The method of claim 10, each one of a surface area of an emission region of each one of the stripe-shaped first organic light-emitting layers and a surface area of an emission region of each one of the dot-shaped organic light-emitting layer, being greater than a surface area of an emission region of each one of the stripe-shaped second organic light-emitting layers, wherein one stripe-shaped first organic light-emitting layer, one dot-shaped organic light-emitting layer, and one stripe-shaped second organic light-emitting layer together constitute one pixel.

* * * * *